US007262860B2

(12) United States Patent
Hill

(10) Patent No.: US 7,262,860 B2
(45) Date of Patent: Aug. 28, 2007

(54) COMPENSATION FOR ERRORS IN OFF-AXIS INTERFEROMETRIC MEASUREMENTS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 284 days.

(21) Appl. No.: 10/980,706

(22) Filed: Nov. 3, 2004

(65) Prior Publication Data

US 2005/0162664 A1    Jul. 28, 2005

Related U.S. Application Data

(63) Continuation-in-part of application No. 10/630,361, filed on Jul. 29, 2003, now abandoned.

(60) Provisional application No. 60/517,426, filed on Nov. 4, 2003, provisional application No. 60/399,170, filed on Jul. 29, 2002.

(51) Int. Cl.
   *G01B 9/02* (2006.01)
(52) U.S. Cl. .................................................. 356/500
(58) Field of Classification Search ................ 356/401, 356/487, 490, 492, 498, 500, 508, 509, 510; 355/53; 250/559.3, 559.37
   See application file for complete search history.

(56) References Cited

U.S. PATENT DOCUMENTS

| 4,606,638 A | 8/1986 | Sommargren |
| 4,711,573 A | 12/1987 | Wijntjes et al. |
| 4,714,339 A | 12/1987 | Lau et al. |
| 4,790,651 A | 12/1988 | Brown et al. |
| 4,802,765 A | 2/1989 | Young et al. |
| 4,859,066 A | 8/1989 | Sommargren |
| 4,881,816 A | 11/1989 | Zanoni |

(Continued)

FOREIGN PATENT DOCUMENTS

JP    7-351078    12/1995

(Continued)

OTHER PUBLICATIONS

Bennett, S.J., "A Double-Passed Michelson Interferometer," Optics Communications, 4:6, pp. 428-430, 1972.

(Continued)

*Primary Examiner*—Samuel A. Turner
(74) *Attorney, Agent, or Firm*—Fish & Richardson P.C.

(57) ABSTRACT

In general, in a first aspect, the invention features a method for determining the location of an alignment mark on a stage, which includes directing a measurement beam along a path between an interferometer and a mirror, wherein at least the interferometer or the mirror is mounted on the stage, combining the measurement beam with another beam to produce an output beam comprising information about the location of the stage, measuring from the output beam a location, $x_1$, of the stage along a first measurement axis, measuring a location, $x_2$, of the stage along a second measurement axis substantially parallel to the first measurement axis, calculating a correction term, $\psi_3$, from predetermined information characterizing surface variations of the mirror for different spatial frequencies, wherein contributions to the correction term from different spatial frequencies are weighted differently, and determining a location of the alignment mark along a third axis parallel to the first measurement axis based on $x_1$, $x_2$, and the correction term.

38 Claims, 8 Drawing Sheets

U.S. PATENT DOCUMENTS

| | | |
|---|---|---|
| 5,064,289 A | 11/1991 | Bockman |
| 5,114,234 A | 5/1992 | Otsuka et al. |
| 5,151,749 A | 9/1992 | Tanimoto et al. |
| 5,187,543 A | 2/1993 | Ebert |
| 5,331,400 A | 7/1994 | Wilkening et al. |
| 5,363,196 A | 11/1994 | Cameron |
| 5,408,318 A | 4/1995 | Slater |
| 5,663,793 A | 9/1997 | de Groot |
| 5,663,893 A | 9/1997 | Wampler et al. |
| 5,724,136 A | 3/1998 | Zanoni |
| 5,757,160 A | 5/1998 | Kreuzer |
| 5,764,361 A | 6/1998 | Kato et al. |
| 5,781,277 A | 7/1998 | Iwamoto |
| 5,790,253 A | 8/1998 | Kamiya |
| 5,801,832 A | 9/1998 | Van Den Brink |
| 6,008,902 A | 12/1999 | Rinn |
| 6,020,964 A | 2/2000 | Loopstra et al. |
| 6,040,096 A | 3/2000 | Kakizaki et al. |
| 6,046,792 A | 4/2000 | Van Der Werf et al. |
| 6,134,007 A | 10/2000 | Naraki et al. |
| 6,137,574 A | 10/2000 | Hill |
| 6,159,644 A | 12/2000 | Satoh et al. |
| 6,160,619 A | 12/2000 | Magome |
| 6,181,420 B1 | 1/2001 | Badami et al. |
| 6,246,481 B1 | 6/2001 | Hill |
| 6,252,668 B1 | 6/2001 | Hill |
| 6,271,922 B1 | 8/2001 | Bulow |
| 6,271,923 B1 | 8/2001 | Hill |
| 6,285,457 B2 | 9/2001 | Ukaji |
| 6,304,318 B1 | 10/2001 | Matsumoto |
| 6,304,382 B1 | 10/2001 | Simon |
| 6,313,918 B1 | 11/2001 | Hill |
| 6,330,105 B1 | 12/2001 | Rozelle et al. |
| 6,384,899 B1 | 5/2002 | den Boef |
| 6,541,759 B1 | 4/2003 | Hill |
| 6,650,419 B2 | 11/2003 | Hill |
| 6,700,665 B2 | 3/2004 | Hill |
| 6,710,884 B2 | 3/2004 | Hill |
| 6,727,992 B2 | 4/2004 | Hill |
| 6,738,143 B2 | 5/2004 | Chu |
| 6,747,744 B2 | 6/2004 | Hill |
| 6,757,066 B2 | 6/2004 | Hill |
| 6,762,845 B2 | 7/2004 | Hill |
| 6,791,693 B2 | 9/2004 | Hill |
| 6,795,197 B2 | 9/2004 | Hill |
| 6,806,961 B2 | 10/2004 | Hill |
| 6,806,962 B2 | 10/2004 | Hill |
| 6,819,434 B2 | 11/2004 | Hill |
| 6,836,335 B2 | 12/2004 | Hill |
| 6,839,141 B2 | 1/2005 | Hill |
| 6,867,867 B2 | 3/2005 | Hill |
| 6,882,430 B2 | 4/2005 | Hill |
| 6,891,624 B2 | 5/2005 | Hill |
| 6,906,784 B2 | 6/2005 | Hill |
| 6,912,054 B2 | 6/2005 | Hill |
| 2001/0035959 A1 | 11/2001 | Hill |
| 2002/0048026 A1 | 4/2002 | Isshiki et al. |
| 2002/0089671 A1 | 7/2002 | Hill |
| 2003/0090675 A1 | 5/2003 | Fujiwara |
| 2004/0046965 A1 | 3/2004 | Hill |
| 2004/0189998 A1 | 9/2004 | Hill |
| 2005/0030549 A1 | 2/2005 | Hill |
| 2005/0134862 A1 | 6/2005 | Hill |
| 2005/0151951 A1 | 7/2005 | Hill |

FOREIGN PATENT DOCUMENTS

| | | |
|---|---|---|
| JP | 8-117083 | 4/1996 |
| JP | 8-117083 | 10/1997 |
| JP | 7-351078 | 11/1997 |
| JP | 10-260009 | 9/1998 |
| WO | WO 01/90686 | 11/2001 |

OTHER PUBLICATIONS

Wu et al. "Analytical modeling of the periodic nonlinearity in heterodyne interferometry." Applied Optics, 37:28, pp. 6696-6700, 1998.

Hines et al. Sub-Nonometer Laser Metrology—Some Techniques and Models. ESO Conference on High-Resolution Imaging by Interferometry II, pp. 1195-1204, 1991.

Bobroff, Norman. "Recent advances in displacement measuring interferometry." Meas. Sci. Technol. 4, pp. 907-926, 1993.

Oka et al. "Polarization heterodyne interferometry using another local oscillator beam." Optics Communications, 92, pp. 1-5, 1992.

Badami et al. "Investigation of NonLinearity in High Accuracy Heterodyne Laser Interferometry." American Society for Precision Engineering, 1997 Proceedings, 16, pp. 153-156, 1997.

Bobroff, Norman. "Residual errors in laser interferometry from air turbulence and nonlinearity." Applied Optics, 26:13, pp. 2676-2686, 1987.

Badami, V.G. et al. "Investigation of nonlinearity in high accuracy heterodyne laser interferometry." 1997 American Society for Precision Engineering Proceedings, 16, pp. 153-156.

Bennett, S.J. "A double-passed michelson interferometer." Optics Communications, 4:6, pp. 428.430, 1972.

Bobroff, N. "Recent advances in displacement measureing interferometry." Meas. Sci. Technol, 4, pp. 907-926, 1993.

Hines et al. "Sub-nonmeter laser metrology—some techniques and models." ESO Conference on High-Resolution Imaging by interferometry II, pp. 1195-1204, 1991.

Oka K. et al. "Polarization heterodyne interferometry using another local oscillator beam." Optics Communication, 92, pp. 1-5, 1992.

Wu, C.M. et al. "Analytical modeling of the periodic nonlinearity in heterodyne interferometry." Applied Optics, 37:28, pp. 6696-6700, 1998.

COMPENSATION FOR ERRORS IN OFF-AXIS INTERFEROMETRIC MEASUREMENTS

CROSS-REFERENCE TO RELATED APPLICATIONS

This application is a continuation-in-part application of and claims priority under 35 U.S.C. §120 to U.S. application Ser. No. 10/630,361, entitled "COMPENSATION FOR ERRORS IN OFF-AXIS INTERFEROMETRIC MEASUREMENTS," filed on Jul. 29, 2003, now abandoned which claims the benefit of Provisional Patent Application No. 60/399,170, filed on Jul. 29, 2002. This application also claims priority under 35 U.S.C. §119(e)(1) to Provisional Patent Application Ser. No. 60/517,426, entitled "COMPENSATION FOR ERRORS IN OFF-AXIS INTERFEROMETRIC MEASUREMENTS," filed on Nov. 4, 2003. The entire contents of U.S. application Ser. No. 10/630,361, Provisional Patent Application No. 60/399,170, and Provisional Patent Application No. 60/517,426 are hereby incorporated by reference.

BACKGROUND

This invention relates to interferometry and to compensating for errors in interferometric measurements.

Distance measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object. In other words, the phase $\Phi$, ideally, is directly proportional to L, and can be expressed as $\Phi = 2pkL\cos^2\theta$, for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, $\Phi$ can be approximated by $\Phi = 2pkL(1-\theta^2)$.

In some embodiments, multiple distance measuring interferometers can be used to monitor multiple degrees of freedom of a measurement object. For example, interferometry systems that include multiple displacement interferometers are used to monitor the location of a plane mirror measurement object in lithography tools. Monitoring the location of a stage mirror relative to two parallel measurement axes provides information about the angular orientation of the stage mirror relative to an axis normal to the plane in which the two measurement axes lie. Such measurements allow a user to monitor the location and orientation of the stage relative to other components of the lithography tool to relatively high accuracy.

SUMMARY

Surface variations due to imperfections in a plane mirror measurement object of an interferometry system introduce errors in displacement and angle measurements made using the interferometry system. The effect of these errors may be amplified when determining the location of a mark located away from the interferometer's measurement axis. However, the effect of these errors on off-axis measurements can be reduced or eliminated if the profile of the mirror surface is known.

Interferometry systems that utilize two interferometers to monitor a plane mirror measurement object along two parallel measurement axes can be used to map the mirror surface profile along a scan line. This is achieved by monitoring the displacement of the mirror surface relative to a reference point on each of the two measurement axes while scanning the mirror in a direction orthogonal to the measurement axes. Provided the stage on which the mirror is mounted does not rotate with respect the interferometers, or where any stage rotation is independently monitored and accounted for, the difference between the displacement measurements provides a measure of the average slope of the mirror surface between the two measurement axes. Furthermore, integrating the slope over the scan line provides a measure of the departure of the mirror surface from a perfectly planar surface (also referred to as mirror "unevenness").

However, correcting interferometry measurements for local slope variations and unevenness of the mirror surface using the aforementioned mirror mapping does not account for mirror surface variations that occur with spatial frequencies proportional to $d^{-1}$, where d is the separation of the measurement axes. Because variations with these spatial frequencies contribute equally to both displacement measurements, they do not contribute to the difference between the displacement measurements and do not contribute to the mirror surface data.

In sensitivity to these variations can be mitigated, at least partially, by transforming mirror surface data into a spatial frequency domain, and weighting the contribution of certain frequency components to an error correction term more heavily than other frequency components. In particular, by weighting frequency components close to $K=2\pi/d$ (and its harmonics) more heavily than other components errors, effects of errors due to the insensitivity of the mirror mapping method can be reduced.

In general, in a first aspect, the invention features a method for determining the location of an alignment mark on a stage, which includes directing a measurement beam along a path between an interferometer and a mirror, wherein at least the interferometer or the mirror is mounted on the stage, combining the measurement beam with another beam to produce an output beam comprising information about the location of the stage, measuring from the output beam a location, $x_1$, of the stage along a first measurement axis, measuring a location, $x_2$, of the stage along a second measurement axis substantially parallel to the first measurement axis, calculating a correction term, $\psi_3$, from predetermined information characterizing surface variations of the mirror for different spatial frequencies, wherein contributions to the correction term from different spatial frequencies are weighted differently, and determining a location of the alignment mark along a third axis parallel to the first measurement axis based on $x_1$, $x_2$, and the correction term.

Embodiments of the method may include one or more of the following features and/or features of other aspects.

$x_1$ and $x_2$ can correspond to the location of the mirror at the first and second measurement axes, respectively. The correction term, $\psi_3$, can be related to departures of the mirror surface at the first measurement axis from a straight line. In some embodiments, the correction term, $\psi_3$, is related to an integral transform of $X_2-X_1$, wherein $X_2$ and $X_1$ correspond to $x_2$ and $x_1$ monitored while scanning the stage in a direction substantially orthogonal to the first and second measurement axes. The integral transform can be a Fourier transform. Contributions to $\psi_3$ from different spatial frequency components of variations of the mirror surface can be weighted to increase the sensitivity of $\psi_3$ to spatial frequency components near K and harmonics of K, wherein K corresponds to the $2\pi/d$ where d is a separation between the first and second measurement axes. The alignment mark location can be related to a location, $x_3$, on the third axis given by $$x_3 = x_1 + \eta(x_2 - x_1) - \psi_3$$

wherein $\eta$ is related to a separation between first measurement axis and the third axis.

The predetermined information can be compiled by monitoring $x_1$ and $x_2$ while scanning the stage in a direction substantially orthogonal to the first and second measurement axes.

The method can further include monitoring the location of the stage along a y-axis substantially orthogonal to the first measurement axis. The location of the alignment mark along the third axis can depend on the location of the stage along the y-axis.

The measurement beam can reflect from the mirror more than once.

In general, in another aspect, the invention features a method that includes correcting measurements of a degree of freedom of a mirror relative to a first axis made using an interferometry system based on information that accounts for surface variations of the mirror for different spatial frequencies, wherein contributions to the correction from the different spatial frequencies are weighted differently.

Embodiments of the method may include one or more of the following features and/or features of other aspects.

The interferometry system can monitor a degree of freedom of the mirror along a second axis and a third axis, wherein the second and third axes are parallel to and offset from the first axis. Contributions to the correction from different spatial frequency components of variations of the mirror surface can be weighted to increase the sensitivity of the correction to spatial frequency components near K and harmonics of K, wherein K corresponds to the $2\pi/d$ where d is a separation between the second and third axes.

In general, in a further aspect, the invention features a method including interferometrically monitoring locations $X_1$ and $X_2$ of a mirror surface relative to respective parallel axes while translating the mirror surface along a path substantially orthogonal to the parallel axes, and determining from the monitored mirror locations contributions from different spatial frequencies to surface imperfections of the mirror.

Embodiments of the method may include features of other aspects.

In general, in another aspect, the invention features an apparatus that includes an interferometer configured to produce an output beam comprising a phase related to an optical path difference between two beam paths, at least one of which contacts a mirror surface, and an electronic controller coupled to the interferometer, wherein during operation the electronic controller determines a position, $x_1$, of the mirror with respect to a first measurement axis based on information derived from the output beam and an error correction term that accounts for surface variations of the mirror for different spatial frequencies, wherein contributions to the error correction term from the different spatial frequencies are weighted differently.

Embodiments of the apparatus can include one or more of the following features and/or features of other aspects.

The apparatus can include a second interferometer configured to produce a second output beam comprising a phase related to an optical path difference between two beam paths, at least one of which contacts the mirror surface, wherein during operation the electronic controller determines a position, $x_2$, of the mirror with respect to a second measurement axis based on information derived from the output beam. The first measurement axis can be parallel to the second measurement axis. During operation of the apparatus, the electronic controller can determine a position, $x_3$, of a mark with respect to a third axis based on $x_1$, $x_2$, and the error correction term, wherein the third axis is parallel to and offset from the first and second measurement axes.

In another aspect, the invention features a lithography system for use in fabricating integrated circuits on a wafer, which includes a stage for supporting the wafer, an illumination system for imaging spatially patterned radiation onto the wafer, a positioning system for adjusting the position of the stage relative to the imaged radiation, and the aforementioned apparatus for monitoring the position of the wafer relative to the imaged radiation.

In a further aspect, the invention features a lithography system for use in fabricating integrated circuits on a wafer, which includes a stage for supporting the wafer, and an illumination system including a radiation source, a mask, a positioning system, a lens assembly, and the aforementioned apparatus, wherein during operation the source directs radiation through the mask to produce spatially patterned radiation, the positioning system adjusts the position of the mask relative to the location of the waver, the lens assembly images the spatially patterned radiation onto the wafer, and the apparatus monitors the position of the mask relative to the location of the wafer.

In yet a further aspect, the invention features a beam writing system for use in fabricating a lithography mask, which includes a source providing a write beam to pattern a substrate, a stage supporting the substrate, a beam directing assembly for delivering the write beam to the substrate, a positioning system for positioning the stage and beam directing assembly relative one another, and the aforementioned apparatus for monitoring the position of the stage relative to the beam directing assembly.

In another aspect, the invention features a lithography method for use in fabricating integrated circuits on a wafer, which includes supporting the wafer on a moveable stage, imaging spatially patterned radiation onto the wafer, adjusting the position of the stage, and monitoring the position of the stage using an aforementioned method.

In still another aspect, the invention features a lithography method for use in the fabrication of integrated circuits, which includes directing input radiation through a mask to produce spatially patterned radiation, positioning the mask relative to a reference frame, monitoring the position of the mask relative to the reference frame using an aforementioned method, and imaging the spatially patterned radiation onto a wafer.

In a further aspect, the invention features a lithography method for fabricating integrated circuits on a wafer including positioning a first component of a lithography system relative to a second component of a lithography system to expose the wafer to spatially patterned radiation, and monitoring the position of the first component relative to the second component using an aforementioned method.

In a further aspect, the invention features a method for fabricating integrated circuits, the method including an aforementioned lithography method.

In another aspect, the invention features a method for fabricating integrated circuits, the method including using an aforementioned lithography system.

In a further aspect, the invention features a method for fabricating a lithography mask, which includes directing a write beam to a substrate to pattern the substrate, positioning the substrate relative to the write beam, and monitoring the position of the substrate relative to the write beam using an aforementioned method.

Embodiments of the invention may include one or more of the following advantages.

Errors in determining the location of off-axis markers due to imperfections in a plane mirror measurement object can be reduced, particularly those errors associated with mirror surface variations with spatial frequencies $\approx 2\pi/d$, and harmonics thereof. The disclosed methods can also be used to reduce errors in on-axis measurements.

Stage mirror measurement objects can be characterized using an interferometry system used in the application in which the interferometry system is ultimately used. This mirror mapping can be performed in situ. Mapping can be repeated to account for changes that may occur over the lifetime of the system.

Due to the disclosed error correction methods, the error tolerances of an interferometer and/or other components can be relaxed without compromising measurement accuracy. Accordingly, in some embodiments, the system can use less expensive components (e.g., mirrors) without compromising measurement accuracy.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

One example of an application in which distance measuring interferometers are used to determine the location of an off-axis marker is for determining the location of alignment marks in a lithography tool (also referred to as a lithography scanner). Alignment marks are reference marks on a wafer and/or stage that are located by an optical alignment scope, often positioned away from the main optical axis of the tool's exposure system.

Figure 1:
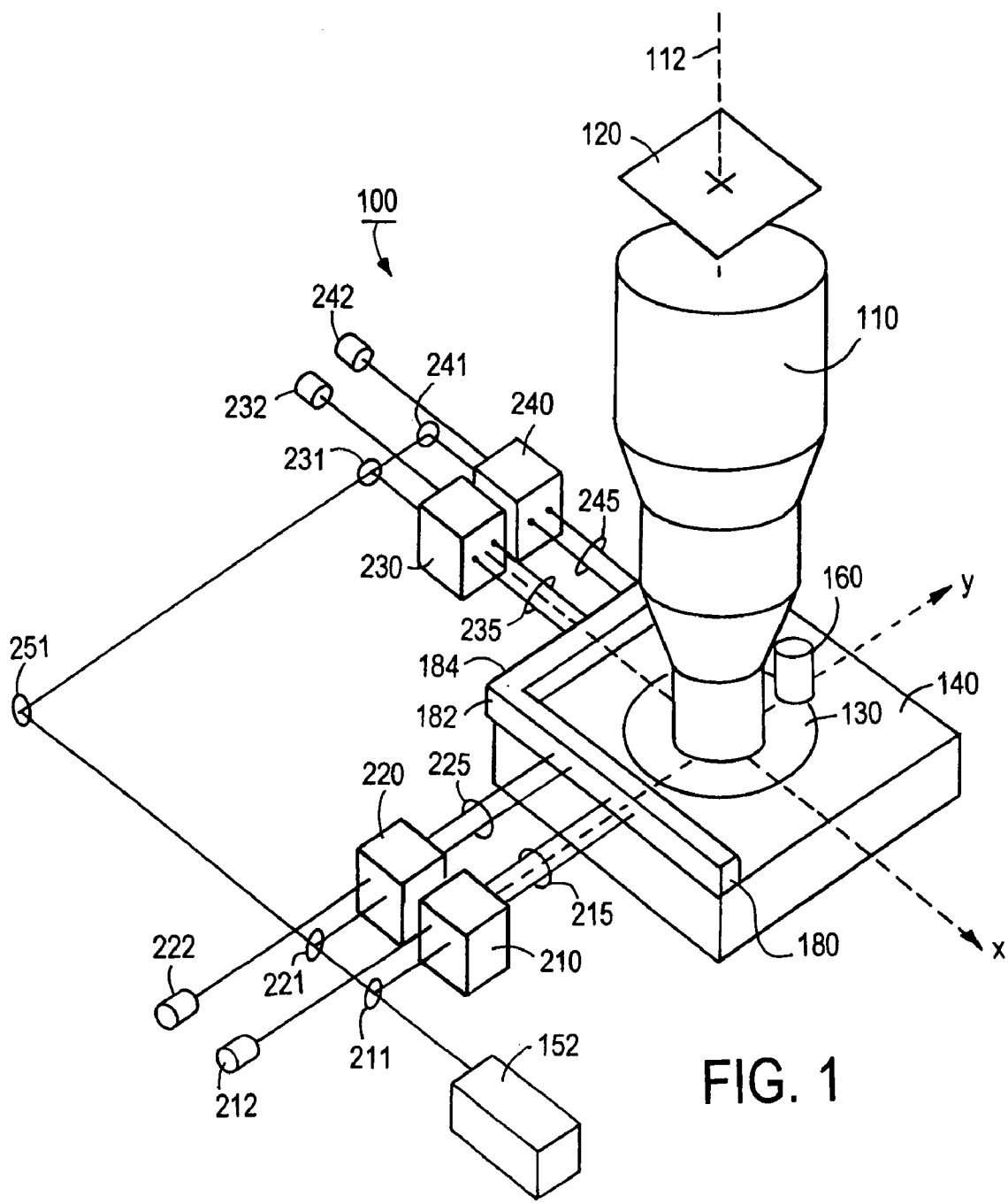
FIG. 1 is a perspective view of an embodiment of a lithography tool.
Figure 2:
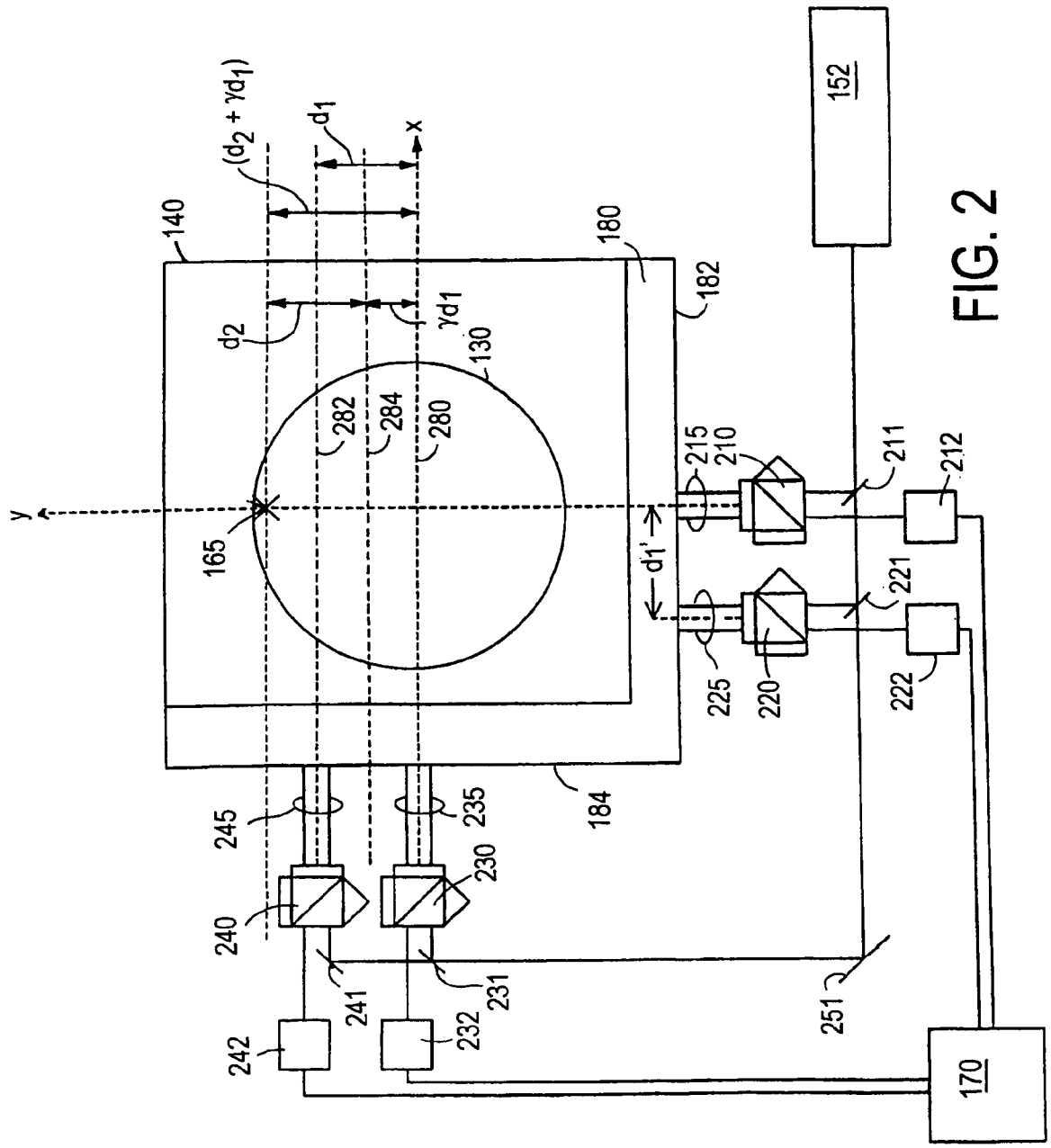
FIG. 2 is a plan view of the stage and interferometry system of the lithography tool shown in FIG. 1.

Referring now to FIG. 1 and FIG. 2, an exemplary lithography tool 100 includes an exposure system 110 positioned to image a reticle 120 onto an exposure region of a wafer 130. Wafer 130 is supported by a stage 140, which scans wafer 130 in a plane orthogonal to an axis 112 of exposure system 110. A stage mirror 180 is mounted on stage 140. Stage mirror 180 includes two nominally orthogonal reflecting surfaces 182 and 184.

An interferometry system monitors the position of stage 140 along orthogonal x- and y-measurement axes. The x- and y-axes intersect with axis 112 of exposure system 110. The interferometry system includes four interferometers 210, 220, 230, and 240. Interferometers 210 and 220 respectively direct measurement beams 215 and 225 parallel to the y-axis to reflect from mirror surface 182. Similarly, interferometers 230 and 240 respectively direct measurement beams 235 and 245 parallel to the x-axis to reflect twice from mirror surface 184. After reflection from the mirror surfaces, each measurement beam is combined with a reference beam to form an output beam. A phase of each output beam is related to the optical path length difference between the measurement and reference beam paths. Detectors 212, 222, 232, and 242 detect the output beams from interferometers 210, 220, 230, and 240, respectively, and communicate optical path length difference information to an electronic controller 170, which determines the stage position from the information and adjusts the position of stage 140 relative to reticle 120 accordingly.

The input beam for each interferometer is derived from a common source, laser light source 152. Beam splitters 211, 221, 231, and mirrors 241 and 251 direct light from light source 152 to the interferometers. Each interferometer splits its input beam into a measurement beam and a reference beam. In the present embodiment, each interferometer directs its respective measurement beam along a path that contacts a surface of mirror 180 twice.

Interferometers 230 and 210 monitor co-ordinates $x_1$ and $y_1$ of the location of mirror surfaces 184 and 182 along the x- and y-axes, respectively. Additionally, interferometers 240 and 220 monitor the location of stage 140 along a second set of axes, offset from but parallel to the x- and y-axes, respectively. The secondary measurements provide co-ordinates $x_2$ and $y_2$ of mirror surfaces 184 and 182, respectively. The separations of these secondary measurement axes from the x- and y-axes are known, and are indicated as d and d' in FIG. 2.

Figure 3:
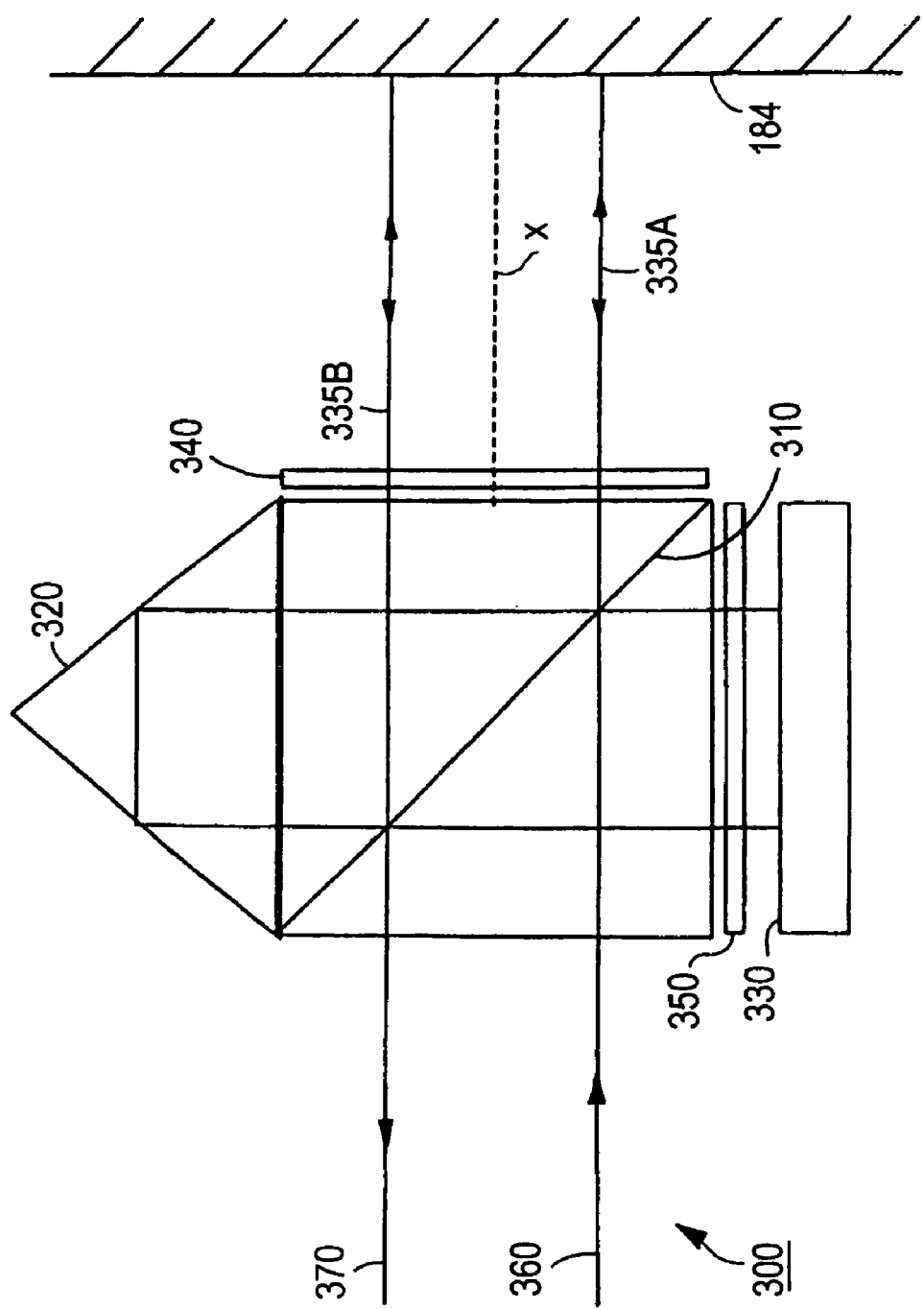
FIG. 3 is a schematic of a high stability plane mirror interferometer.

In some embodiments, interferometers 210, 220, 230, and 240 are high stability plane mirror interferometers (HSPMIs). Referring to FIG. 3, an HSMPI 300 includes a polarizing beam splitter (PBS) 310, a retroreflector 320, and a reference mirror 330. HSPMI 300 also includes quarter wave plates 340 and 350, positioned between PBS 310 and mirror surface 184 or reference mirror 330, respectively.

During operation, PBS 310 splits the input beam, indicated as beam 360 in FIG. 3, into orthogonally polarized components. One component, measurement beam 335A, is transmitted by PBS 310 and reflects from mirror surface 184 back towards PBS 310. On its return to PBS 310, the polarization state of the measurement beam is now orthogonal to its original polarization state due to the passing through quarter wave plate 340 twice, and the measurement beam is reflected by PBS 310 towards retroreflector 320. Retroreflector 320 directs the measurement beam back towards PBS 310, which reflects the measurement beam towards mirror surface 184. On the second pass to mirror surface 184, the measurement beam is indicated as beam 335B. Again, mirror surface 184 reflects beam 335B towards PBS 310. The double pass through quarter wave plate 340 transforms the polarization state of the measurement beam back to its original state, and it is transmitted by PBS 310 and exits HSPMI 300 as a component of an output beam 370.

The reference beam is the component of input beam 360 initially reflected by PBS 310. The reference beam passes between PBS 310 and reference mirror 330 twice. On each pass, quarter wave plate 350 transforms the polarization state of the reference beam by 90°. Thus, after the first pass of the reference beam to reference mirror 330, PBS 310 transmits the reference beam. After the reference beam's second pass to reference mirror 330, PBS 310 reflects the reference beam, which exits the interferometer 300 as a component of output beam 370.

Displacement measuring interferometers other than HSPMI's can also be used in system 100. Examples of other displacement measuring interferometers include single beam interferometers and/or high accuracy plane mirror interferometers (in which the measurement beam can pass to the measurement object more than twice, e.g., four times). Furthermore, although the foregoing discussion includes a description of heterodyne interferometry, homodyne detection schemes can also be used.

Referring again to FIG. 1 and FIG. 2, lithography tool 100 also includes an alignment scope 160, positioned off-axis from axis 112. Alignment scope 160 is positioned to locate objects at a position on the y-axis, offset from the x-axis by an amount $\eta d$. In the present embodiment, a user locates an alignment mark with alignment scope 160. Because the position of alignment scope 180 with respect to exposure system 110 and the x- and y-axes is known, once the user locates alignment mark 165 with the scope, the location of the alignment mark with respect to the exposure system is known. The values of $x_1$, $x_2$, $y_1$, and $y_2$ that are measured once the user has located alignment mark 165 provide a set of reference co-ordinates indicative of the alignment mark's location on the stage. Based on these reference co-ordinates, the user can accurately translate the wafer on the stage with respect to the exposure system to locate target regions of the wafer on axis 112.

Figure 4:
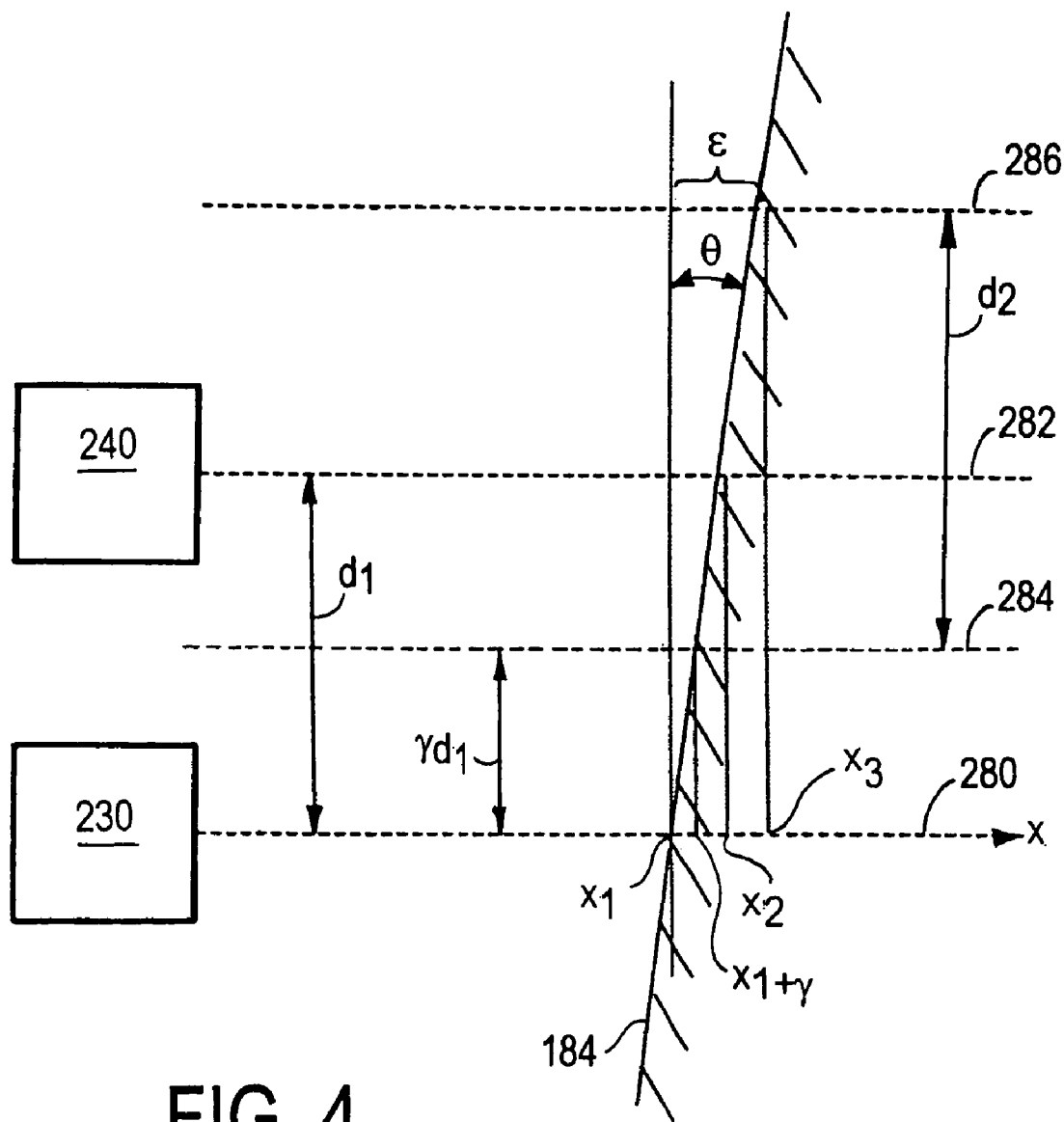
FIG. 4 is a schematic showing an Abbe offset error.

Any repositioning of the stage based on the reference co-ordinates should account for the angular orientation of the stage when alignment mark 165 is located by alignment scope 160. The effect of stage orientation is illustrated in FIG. 4, which shows the first and second measurement axes as well as an axis 400, parallel to the x-axis, on which the alignment scope is located. The location of the mirror along these axes is given by $x_1$, $x_2$, and $x_3$, respectively. Where $\theta$ is zero, $x_1 = x_2 = x_3$. However, for non-zero $\theta$, $x_3 - x_1 = \eta d \tan \theta \equiv \epsilon$. The offset, $\gamma$, is referred to as the Abbe offset error.

For a perfectly flat mirror and for small $\theta$, $$\theta = \frac{x_2 - x_1}{d}, \tag{1}$$

however, as discussed previously, imperfections in the mirror surface (e.g., surface unevenness and/or local slope variations) introduce errors into the interferometrically observed values of $x_1$ and $x_2$. Hereinafter, observable parameters are indicated by a tilde. Subsequently, interferometers 230 and 240 measure $\tilde{x}_1$ and $\tilde{x}_2$, respectively, wherein $\tilde{x}_1 = x_1 + \psi_1$ and $\tilde{x}_2 = x_2 + \psi_2$, where $\psi_1$ and $\psi_2$ represent deviations of the measured values from those for a perfect mirror. Substituting $\tilde{x}_1$ and $\tilde{x}_2$ for $x_1$ and $x_2$ in Eq. (1), yields $$\theta = \frac{(\tilde{x}_2 - \tilde{x}_1)}{d} - \frac{(\psi_2 - \psi_1)}{d}. \tag{2}$$

Accordingly, for small $\theta$, the Abbe offset error becomes $$\varepsilon = \eta d \left[ \frac{\tilde{x}_2 - \tilde{x}_1}{d} - \frac{\psi_2 - \psi_1}{d} \right], \tag{3}$$

which can be recast as $$\tilde{x}_3 = \tilde{x}_1 + \eta d \frac{\tilde{x}_2 - \tilde{x}_1}{d} - \psi_3, \tag{4}$$

where $\psi_3$ is an error correction term accounting for imperfections in the surface of the mirror.

The error correction term, $\psi_3$, can be determined from a mirror map measured in a mirror characterization mode. In the mirror characterization mode, stage 140 is translated in the y-direction so that measurement beam 235 and 245 of interferometers 230 and 240, respectively, scans mirror surface 184 along a datum line and generates signals containing information indicative of its angular orientation and apparent surface departure (i.e., surface unevenness) in the x-y plane from a plane in the x-direction, along with any contributions due to variations in the translation mechanism for moving stage 140 and other sources of error (e.g., cyclic non-linearities, and stationary and non-stationary effects of a gas in measurement paths of beams of interferometers 230 and 240). The scan produces $\tilde{X}_1(y)$ and $\tilde{X}_2(y)$, corresponding to displacement measurements from interferometers 230 and 240 respectively.

Simultaneous with translation of stage 140 in the y-direction, interferometers 210 and 220 monitor the orientation of mirror surface 182 for fixed intercept points of measurement beams 215 and 225 with surface 182. This step permits measurement of the rotation of stage 140 due to mechanical contributions of its translation mechanism, such as bearings, drive mechanisms, and the like. Measurement of the angular orientation of mirror surface 182 provides a redundant measure of the angular orientation, $\tilde{\theta}(y)$, of stage 140 during the scan, which can be used to remove the contribution of angular rotations of stage 140 from the $\tilde{X}_1(y)$ and $\tilde{X}_2(y)$ data.

Once corrected for angular rotations of stage 140, $\tilde{X}_1(y)$ and $\tilde{X}_2(y)$ provides a measure of the average slope of mirror surface 184 along the datum line. Where there is no contribution from stage rotations, the average slope, $\langle dx/dy \rangle_{Map}$, is given by $$\left\langle \frac{dx}{dy} \right\rangle_{Map}(y) = \frac{\tilde{X}_2(y) - \tilde{X}_1(y)}{d}, \tag{5}$$

where the subscript Map refers to data acquired during the mirror mapping mode. A linear fit to the $\langle dx/dy \rangle_{Map}$ data yields $\langle dx/dy \rangle_{fit}$, which provides a nominal reference surface. The error function $\psi_3$ is then determined according to deviations of the mirror surface from $\langle dx/dy \rangle_{fit}$ based on the following formalism.

The Fourier transform of the average slope $\langle dx/dy \rangle_{Map}$ may be written as $$F\left[\left\langle \frac{dx}{dy} \right\rangle_{Map}\right] = F\left\{\frac{1}{d}\left[X_2\left(x, y\left\langle \frac{dx}{dy} \right\rangle_{fit}\right) - X_1\left(x, y, \left\langle \frac{dx}{dy} \right\rangle_{fit}\right)\right]\right\} \tag{6}$$

where $$F\left\{\tilde{X}_2\left(x, y, \left\langle \frac{dx}{dy} \right\rangle_{fit}\right) - \tilde{X}_1\left(x, y, \left\langle \frac{dx}{dy} \right\rangle_{fit}\right)\right\} = \tag{7}$$

$$\frac{1}{\sqrt{2\pi}}\left[\int \tilde{X}_2\left(x, y, \left\langle \frac{dx}{dy} \right\rangle_{fit}\right)e^{iKy}dy - \int \tilde{X}_1\left(x, y, \left\langle \frac{dx}{dy} \right\rangle_{fit}\right)e^{iKy}dy\right].$$

The relationship between $\psi_1(x,y,\langle dx/dy \rangle_{fit})$ and $\tilde{X}_1(x, y, \langle dx/dy \rangle_{fit})$ is $$\psi_1(x,y,\langle dx/dy \rangle_{fit}) = \tilde{X}_1(x,y,\langle dx/dy \rangle_{fit}) - \tilde{X}_1(x,0,\langle dx/dy \rangle_{fit}) - y\langle dx/dy \rangle_{fit}. \tag{8}$$

It is also noted that $$\tilde{X}_2(x,y,\langle dx/dy \rangle_{fit}) = \tilde{X}_1(x,y+d,\langle dx/dy \rangle_{fit}) + [\tilde{X}_2(x,0,\langle dx/dy \rangle_{fit}) - \tilde{X}_1(x,0,\langle dx/dy \rangle_{fit})] + d\langle dx/dy \rangle_{fit} \tag{9}$$

Eqs. (7) and (9) are solved according to the following sequence of mathematical operations for the Fourier transform of $\tilde{X}_1(x,y,\langle dx/dy \rangle_{fit})$ as a function of spatial frequency in the y direction. In the following sequence of mathematical operations, $\tilde{X}_1(x,y,\langle dx/dy \rangle_{fit})$ and/or $\tilde{X}_2(x,y,\langle dx/dy \rangle_{fit})$ may appear in a simplified notations with a reduced number of parameters indicated such as $\tilde{X}_1$ and/or $\tilde{X}_2$, respectively, or as $\tilde{X}_1(x,y)$ and/or $\tilde{X}_2(x,y)$, respectively.

$$F[\{\tilde{X}_2 - \tilde{X}_1\}] = \frac{1}{\sqrt{2\pi}}\left[\int \tilde{X}_1(x, y+d)e^{iKy}dy - \int \tilde{X}_1(x, y)e^{iKy}dy\right] + \tag{10}$$

$$\frac{1}{\sqrt{2\pi}}\int\left\{\left[\tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right)\right] + d\left\langle \frac{dx}{dy} \right\rangle_{fit}\right\}e^{iKy}dy$$

$$F[\{\tilde{X}_2 - \tilde{X}_1\}] = \tag{11}$$

$$\frac{1}{\sqrt{2\pi}}\int \tilde{X}_1(x, y')e^{iKy(y'-d)}dy' - \frac{1}{\sqrt{2\pi}}\int \tilde{X}_1(x, y)e^{iKy}dy + \frac{1}{\sqrt{2\pi}}$$

$$\int\left\{\left[\tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right)\right] + d\left\langle \frac{dx}{dy} \right\rangle_{fit}\right\}e^{iKy}dy.$$

$$F[\{\tilde{X}_2 - \tilde{X}_1\}] = \tag{12}$$

$$\frac{1}{\sqrt{2\pi}}[e^{-iKd} - 1]\int \tilde{X}_1(x, y)e^{iKy}dy + \int \tilde{X}_1(x, y)e^{iKy}dy + \frac{1}{\sqrt{2\pi}}$$

$$\int\left\{\left[\tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right)\right] + d\left\langle \frac{dx}{dy} \right\rangle_{fit}\right\}e^{iKy}dy.$$

$$F[\{\tilde{X}_2 - \tilde{X}_1\}] = -2ie^{-iKd/2}\sin(Kd/2)F[\tilde{X}_1(x, y)] + \frac{1}{\sqrt{2\pi}} \tag{13}$$

$$\int\left\{\left[\tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right)\right] + d\left\langle \frac{dx}{dy} \right\rangle_{fit}\right\}e^{iKy}dy.$$

$$F[\tilde{X}_1(x, y)] = i\frac{1}{2}\left[\frac{e^{i(Kd/2)}}{\sin(Kd/2)}\right] \times \tag{14}$$

$$\left\{F\left\{\begin{array}{l}[\tilde{X}_2(x, y) - \tilde{X}_1(x, y)] - \\ \left[\tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right)\right] - d\left\langle \frac{dx}{dy} \right\rangle\end{array}\right\}\right\}.$$

The Fourier transform $F[\psi_1(x,y,\langle dx/dy \rangle_{fit})]$ is related to $F[\tilde{X}_1(x,y)]$ according to Eq. (8) as (15)

$$\psi_1\left(x, y, \left\langle \frac{dx}{dy} \right\rangle_{fit}\right) = i\frac{1}{2}\frac{1}{\sqrt{2\pi}} \times$$

$$\int\left\{\begin{array}{l}F\left\{\begin{array}{l}[\tilde{X}_2(x, y') - \tilde{X}_1(x, y')] - \\ \left[\tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right)\right] - d\left\langle \frac{dx}{dy} \right\rangle\end{array}\right\} \times \\ \frac{1}{\sin(Kd/2)}e^{-iK(y-d/2)}dK\end{array}\right\}.$$

An expression for $\psi_2(x,y) - \psi_1(x,y)$ obtained using Eq. (8) and a corresponding equation for $\psi_2$ and the expression $\psi_3 = \eta(\psi_2 - \psi_1) + \psi_1$ are used to obtain the following expression for $\psi_3$, $$\psi_3 = \eta \left\{ \begin{array}{l} \left[ \tilde{X}_2\left(x, y, \left\langle \frac{dx}{dy} \right\rangle_{fit}\right) - \tilde{X}_1\left(x, y, \left\langle \frac{dx}{dy} \right\rangle_{fit}\right) \right] - \\ \left[ \tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right) \right] - d\left\langle \frac{dx}{dy} \right\rangle \end{array} \right\} + i \frac{1}{2} \frac{1}{\sqrt{2\pi}} \times \quad (16)$$

$$\int \left\{ F \left\{ \begin{array}{l} [\tilde{X}_2(x, y') - \tilde{X}_1(x, y')] - \\ \left[ \tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right) \right] - d\left\langle \frac{dx}{dy} \right\rangle \end{array} \right\} \times \frac{1}{\sin(Kd/2)} e^{-iK(y-d/2)} dK \right\}. \quad (17)$$

$$\psi_3 = \eta \left\{ \begin{array}{l} \left[ \tilde{X}_2\left(x, y, \left\langle \frac{dx}{dy} \right\rangle_{fit}\right) - \tilde{X}_1\left(x, y, \left\langle \frac{dx}{dy} \right\rangle_{fit}\right) \right] - \\ \left[ \tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right) \right] - d\left\langle \frac{dx}{dy} \right\rangle \end{array} \right\} +$$

$$i \frac{1}{4\pi} \int \left\{ \begin{array}{l} [\tilde{X}_2(x, y') - \tilde{X}_1(x, y')] - \\ \left[ \tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right) \right] - d\left\langle \frac{dx}{dy} \right\rangle \end{array} \right\} dy' \times$$

$$\int \frac{1}{\sin(Kd/2)} e^{-iK[(y-y')-d/2]} dK.$$

Thus, $$\psi_3 = \eta \left\{ \begin{array}{l} \left[ \tilde{X}_2\left(x, y, \left\langle \frac{dx}{dy} \right\rangle_{fit}\right) - \tilde{X}_1\left(x, y, \left\langle \frac{dx}{dy} \right\rangle_{fit}\right) \right] - \\ \left[ \tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right) \right] - d\left\langle \frac{dx}{dy} \right\rangle \end{array} \right\} + \quad (18)$$

$$\int I(y, y') \left\{ \begin{array}{l} [\tilde{X}_2(x, y') - \tilde{X}_1(x, y')] - \\ \left[ \tilde{X}_2\left(x, 0, \left\langle \frac{dx}{dy} \right\rangle_{fit}\right) - \tilde{X}_1\left(x, 0, \left\langle \frac{dx}{dy} \right\rangle_{fit}\right) \right] - \\ d\left\langle \frac{dx}{dy} \right\rangle \end{array} \right\} dy',$$

Where, $$I(y, y') \equiv i \frac{1}{4\pi} \int \frac{1}{\sin(Kd/2)} e^{-iK[(y-y')-d/2]} dK. \quad (19)$$

The kernal I(y, y') weights contributions to $\psi_3$ from spatial frequencies close to $K=2\pi/d$ and harmonics thereof more heavily than other spatial frequencies. However, the kernal I(y,y') has singularities for $$Kd/2=0,\pi,2\pi, \quad (20)$$

Accordingly, a multiplicative weighting function should be introduced to the kernal to limit any negative effect of the singularities. The design of the multiplicative weighting function can be based on considerations of the signal-to-noise ratios as a function of spatial frequency. One example of a multiplicative weighting function is $$f(K) = \begin{cases} 0 & \text{for } \frac{2\pi m}{d} - \delta K < K < \frac{2\pi m}{d} + \delta K \\ 1 & \text{otherwise} \end{cases}, \quad (21)$$

where m is an integer and $\delta K<<2\pi/d$. Other multiplicative weighting functions can also be used.

Although the preceding derivation results in a particular kernal for $\psi_3$ which includes a weighing function $\sin^{-1}(Kd/2)$, in other embodiments other weighting functions may be used. Generally, the weighting function should increase sensitivity to those components of the mirror surface profile to which the mirror characterization method is least sensitive. Examples of weighting functions include linear, geometric, and exponential functions of K.

In some embodiments, information about the mirror obtained during the mirror characterization mode can be used to correct for on-axis measurements as well. Furthermore, mirror surface 182 can also be characterized using a similar mirror characterization mode, and this information can be used to reduce errors in both on and/or off-axis measurements along the y-axis.

In addition, in some embodiments, additional errors introduced by various components in the interferometry system can be reduced using other methods. For example, non-cyclic errors in the interferometers can be reduced using techniques disclosed in U.S. patent application Ser. No. 10/366,587, entitled "CHARACTERIZATION AND COMPENSATION OF NON-CYCLIC ERRORS IN INTERFEROMETRY SYSTEMS," filed on Feb. 12, 2003, the contents of which is hereby incorporated by reference in its entirety.

In some embodiments, the off-axis measurement is corrected for errors associated with mirror surface imperfections prior to the off-axis position information being sent to a control system that controls the orientation of stage 140, thereby preventing transferal of these errors to the position of the stage.

Lithography tools, such as tool 100, are especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p.82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

As discussed previously, to properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 5:
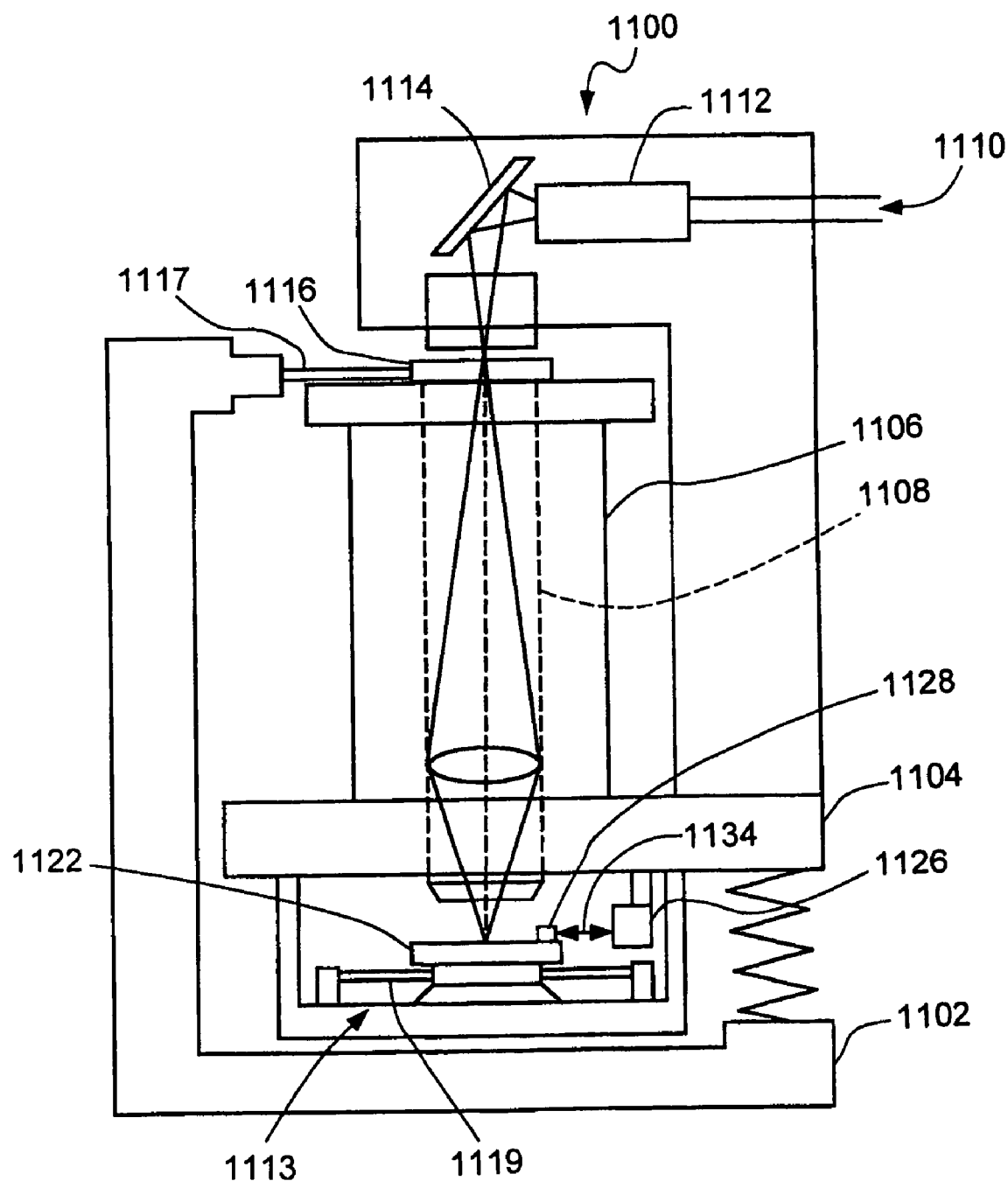
FIG. 5 is a schematic diagram of an embodiment of a lithography tool that includes an interferometer.

Another example of a lithography tool 1100 using an interferometry system 1126 is shown in FIG. 5. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithozraphy: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 6A:
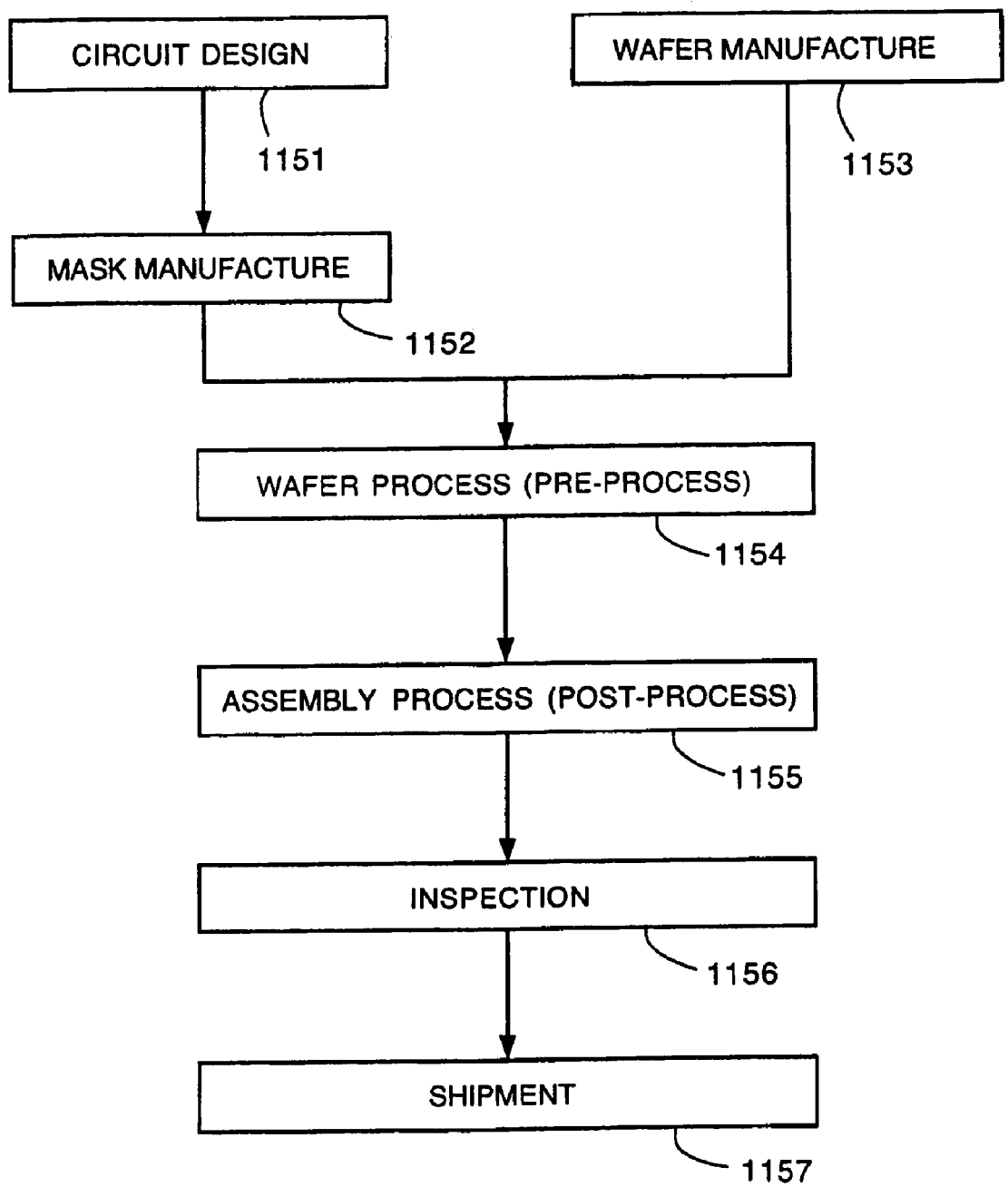
FIG. 6(*a*) and FIG. 6(*b*) are flow charts that describe steps for making integrated circuits.
Figure 6B:
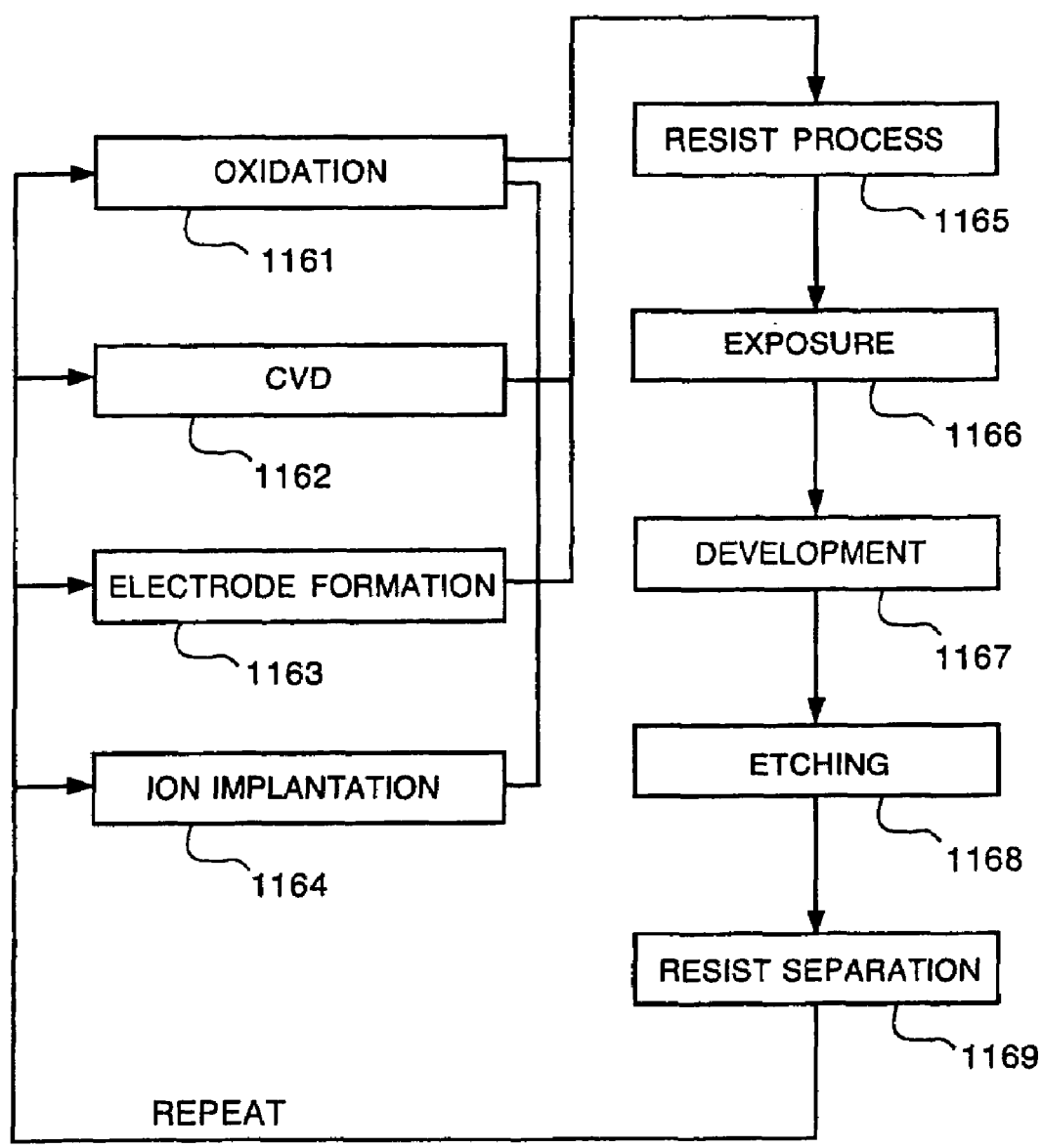

As is well known in the art, lithography is a critical part of manufacturing methods for making semiconducting devices. For example, U.S. Pat. No. 5,483,343 outlines steps for such manufacturing methods. These steps are described below with reference to FIGS. 6(*a*) and 6(*b*). FIG. 6(*a*) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

FIG. 6(*b*) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
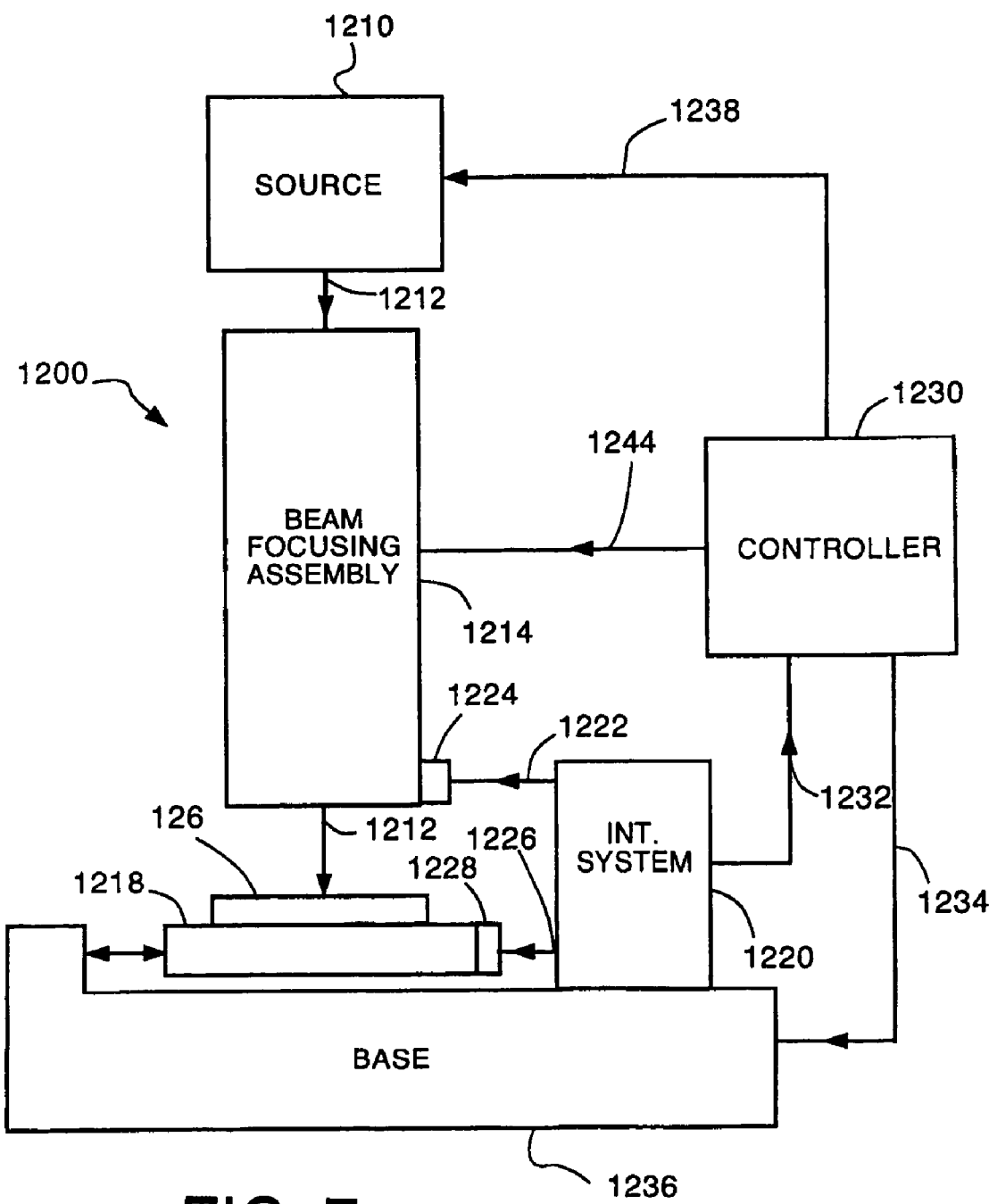
FIG. 7 is a schematic of a beam writing system that includes an interferometry system.

As an example, a schematic of a beam writing system 1200 is shown in FIG. 7. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method for determining the location of an alignment mark on a stage, the method comprising:

directing a measurement beam along a path between an interferometer and a mirror, wherein at least the interferometer or the mirror is mounted on the stage;

combining the measurement beam with another beam to produce an output beam comprising information about the location of the stage;

measuring from the output beam a location, $x_1$, of the stage along a first measurement axis;

measuring a location, $x_2$, of the stage along a second measurement axis substantially parallel to the first measurement axis;

calculating a correction term, $\psi_3$, from predetermined information characterizing surface variations of the mirror for different spatial frequencies, wherein contributions to the correction term from different spatial frequencies are weighted differently;

determining a location of the alignment mark along a third axis parallel to the first measurement axis based on $x_1$, $x_2$, and the correction term; and outputting a signal from an electronic controller based on the determined location of the alignment mark.

2. The method of claim 1, wherein $x_1$ and $x_2$ correspond to the location of the mirror at the first and second measurement axes, respectively.

3. The method of claim 1, wherein the correction term, $\psi_3$, is related to departures of the mirror surface at the first measurement axis from a straight line.

4. The method of claim 1, wherein the correction term, $\psi_3$, is related to an integral transform of $X_2-X_1$, wherein $X_2$ and $X_1$ correspond to $x_2$ and $x_1$ monitored while scanning the stage in a direction substantially orthogonal to the first and second measurement axes.

5. The method of claim 4, wherein the integral transform is a Fourier transform.

6. The method of claim 4, wherein contributions to $\psi_3$ from different spatial frequency components of variations of the mirror surface are weighted to increase the sensitivity of $\psi_3$ to spatial frequency components near $K_d$ and harmonics of $K_d$, wherein $K_d$ corresponds to the $2\pi/d$ where d is a separation between the first and second measurement axes.

7. The method of claim 3, wherein the alignment mark location is related to a location, $x_3$, on the third axis given by $$x_3 = x_1 + \eta(x_2 - x_1) - \psi_3,$$

wherein $\eta$ is related to a separation between first measurement axis and the third axis.

8. The method of claim 1, wherein the predetermined information is compiled by monitoring $x_1$ and $x_2$ while scanning the stage in a direction substantially orthogonal to the first and second measurement axes.

9. The method of claim 1, further comprising monitoring the location of the stage along a y-axis substantially orthogonal to the first measurement axis.

10. The method of claim 9, wherein the location of the alignment mark along the third axis depends on the location of the stage along the y-axis.

11. The method of claim 1, wherein the measurement beam reflects from the mirror more than once.

12. The method of claim 1, further comprising adjusting the position of the stage based on the output signal.

13. A method comprising:

correcting measurements of a degree of freedom of a mirror relative to a first axis made using an interferometry system based on information that accounts for surface variations of the mirror for different spatial frequencies, wherein contributions to the correction from the different spatial frequencies are weighted differently; and outputting a signal from an electronic controller based on the corrected measurements.

14. The method of claim 13, wherein the interferometry system monitors a degree of freedom of the mirror along a second axis and a third axis, wherein the second and third axes are parallel to and offset from the first axis.

15. The method of claim 14, wherein contributions to the correction from different spatial frequency components of variations of the mirror surface are weighted to increase the sensitivity of the correction to spatial frequency components near $K_d$ and harmonics of $K_d$, wherein $K_d$ corresponds to the $2\pi/d$ where d is a separation between the second and third axes.

16. The method of claim 13, further comprising adjusting the position of the mirror based on the output signal.

17. A lithography method for use in fabricating integrated circuits on a wafer, the method comprising:

supporting the wafer on a moveable stage;

imaging spatially patterned radiation onto the wafer;

adjusting the position of the stage; and monitoring the position of the stage, the monitoring comprising measuring a degree of freedom of a mirror using an interferometry system, where the mirror or a component of the interferometry system is attached to the stage, and using the method of claim 13 to correct the measurement of the degree of freedom.

18. A method for fabricating integrated circuits, the method comprising:

applying a resist to a wafer;

forming a pattern of a mask in the resist by exposing the wafer to radiation using the lithography method of claim 17; and producing an integrated circuit from the wafer.

19. A lithography method for use in the fabrication of integrated circuits comprising:

directing input radiation through a mask to produce spatially patterned radiation;

positioning the mask relative to the input radiation;

monitoring the position of the mask relative to the input radiation, the monitoring comprising measuring a degree of freedom of a mirror using an interferometry system, where the mirror or a component of the interferometry system is attached to the stage, and using the method of claim 13 to correct the measurement of the degree of freedom; and imaging the spatially patterned radiation onto a wafer.

20. A method for fabricating integrated circuits, the method comprising:

applying a resist to a wafer;

forming a pattern of a mask in the resist by exposing the wafer to radiation using the lithography method of claim 19; and producing an integrated circuit from the wafer.

21. A lithography method for fabricating integrated circuits on a wafer comprising:

positioning a first component of a lithography system relative to a second component of a lithography system to expose the wafer to spatially patterned radiation; and monitoring the position of the first component relative to the second component, wherein the first or second component comprises a mirror and the monitoring comprises measuring a degree of freedom of the mirror and using the method of claim 13 to correct the measurement of the degree of freedom.

22. A method for fabricating integrated circuits, the method comprising:

applying a resist to a wafer;

forming a pattern of a mask in the resist by exposing the wafer to radiation using the lithography method of claim 21; and producing an integrated circuit from the wafer.

23. A method for fabricating a lithography mask, the method comprising:

directing a write beam to a substrate to pattern the substrate;

positioning the substrate relative to the write beam using a stage; and monitoring the position of the substrate relative to the write beam, the monitoring comprising measuring a degree of freedom of a mirror using an interferometry system, where the mirror or a component of the interferometry system are attached to the stage, and using the method of claim 13 to correct the measurement of the degree of freedom.

24. A method comprising:

interferometrically monitoring locations $X_1$ and $X_2$ of a mirror surface relative to respective parallel axes while translating the mirror surface along a path substantially orthogonal to the parallel axes;

determining from the monitored mirror locations contributions from different spatial frequencies to surface imperfections of the mirror; and outputting a signal from an electronic controller based on the determined contributions from the different spatial frequencies to surface imperfections of the mirror.

25. The method of claim 24, wherein the output signal comprises information about the surface of the mirror.

26. The method of claim 25, further comprising positioning the mirror relative to an axis based on a measurement that uses the information about the surface of the mirror.

27. An apparatus comprising:

an interferometer configured to produce an output beam comprising a phase related to an optical path difference between two beam paths, at least one of which contacts a mirror surface; and an electronic controller coupled to the interferometer, wherein during operation the electronic controller determines a position, $x_1$, of the mirror with respect to a first measurement axis based on information derived from the output beam and an error correction term that accounts for surface variations of the mirror for different spatial frequencies, wherein contributions to the error correction term from the different spatial frequencies are weighted differently.

28. The apparatus of claim 27, further comprising a second interferometer configured to produce a second output beam comprising a phase related to an optical path difference between two beam paths, at least one of which contacts the mirror surface, wherein during operation the electronic controller determines a position, $x_2$, of the mirror with respect to a second measurement axis based on information derived from the output beam.

29. The apparatus of claim 27, wherein the first measurement axis is parallel to the second measurement axis.

30. The apparatus of claim 29, wherein during operation the electronic controller determines a position, $x_3$, of a mark with respect to a third axis based on $x_1$, $x_2$, and the error correction term, wherein the third axis is parallel to and offset from the first and second measurement axes.

31. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the imaged radiation; and the apparatus of claim 27 for monitoring the position of the wafer relative to the imaged radiation.

32. A method for fabricating integrated circuits, the method comprising:

applying a resist to a wafer;

forming a pattern of a mask in the resist by exposing the wafer to radiation using the lithography system of claim 31; and producing an integrated circuit from the wafer.

33. A lithography system for use in fabricating integrated circuits on a wafer, the system comprising:

a stage for supporting the wafer; and an illumination system including a radiation source, a mask, a positioning system, a lens assembly, and the apparatus of claim 27, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

34. A method for fabricating integrated circuits, the method comprising:

applying a resist to a wafer;

forming a pattern of a mask in the resist by exposing the wafer to radiation using the lithography system of claim 33; and producing an integrated circuit from the wafer.

35. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the apparatus of claim 27 for monitoring the position of the stage relative to the beam directing assembly.

36. A lithography method for use in the fabrication of integrated circuits comprising:

directing input radiation through a mask to produce spatially patterned radiation;

positioning the mask relative to the input radiation;

monitoring the position of the mask relative to the input radiation, wherein the monitoring comprises measuring a degree of freedom of a mirror using an interferometry system, where the mirror or a component of the interferometry system is attached to the stage, and correcting the measurement based on information that accounts for surface variations of the mirror for different spatial frequencies, wherein contributions to the correction from the different spatial frequencies are weighted differently; and imaging the spatially patterned radiation onto a wafer.

37. A lithography method for fabricating integrated circuits on a wafer comprising:

positioning a first component of a lithography system relative to a second component of a lithography system to expose the wafer to spatially patterned radiation; and monitoring the position of the first component relative to the second component, wherein the first or second component comprises a mirror and the monitoring comprises measuring a degree of freedom of the mirror, wherein the monitoring comprises correcting the measured degree of freedom based on information that accounts for surface variations of the mirror for different spatial frequencies, wherein contributions to the correction from the different spatial frequencies are weighted differently.

38. An apparatus comprising:
  an interferometer configured to produce an output beam comprising a phase related to an optical path difference between two beam paths, at least one of which contacts a mirror surface; and
  a means for determining a position, $x_1$, of the mirror with respect to a first measurement axis based on information derived from the output beam and an error correction term that accounts for surface variations of the mirror for different spatial frequencies, wherein contributions to the error correction term from the different spatial frequencies are weighted differently.

* * * * *